United States Patent
Ning et al.

(10) Patent No.: US 12,288,828 B1
(45) Date of Patent: Apr. 29, 2025

(54) PHOTOVOLTAIC LAMP USING UV ADHESIVE AND GLASS COVER FOR PACKAGING

(71) Applicant: FULIJIATE NANTONG NEW ENERGY TECHNOLOGY CO., LTD., Nantong (CN)

(72) Inventors: Zengming Ning, Nantong (CN); Qingquan Wang, Nantong (CN)

(73) Assignee: FULIJIATE NANTONG NEW ENERGY TECHNOLOGY CO., LTD., Nantong (CN)

( * ) Notice: Subject to any disclaimer, the term of this patent is extended or adjusted under 35 U.S.C. 154(b) by 0 days.

(21) Appl. No.: 18/429,552

(22) Filed: Feb. 1, 2024

(51) Int. Cl.
  *H01L 31/048* (2014.01)
  *H01L 31/05* (2014.01)

(52) U.S. Cl.
  CPC .......... *H01L 31/0481* (2013.01); *H01L 31/05* (2013.01)

(58) Field of Classification Search
  CPC ............................ H01L 31/0481; H01L 31/05
  See application file for complete search history.

(56) References Cited

U.S. PATENT DOCUMENTS

| | | | | |
|---|---|---|---|---|
| 4,394,860 A | * | 7/1983 | Smith ................. | H01L 31/0547 362/147 |
| 2011/0228523 A1 | * | 9/2011 | Zheng ................. | H01L 31/0521 362/184 |
| 2020/0018454 A1 | * | 1/2020 | Izradel ...................... | F21V 3/02 |
| 2020/0223150 A1 | * | 7/2020 | Kajiya .................. | B32B 43/006 |

FOREIGN PATENT DOCUMENTS

| | | | | | |
|---|---|---|---|---|---|
| CN | 204268340 U | * | 4/2015 | ................ | F21S 9/03 |
| CN | 109058905 A | * | 12/2018 | ........... | H01L 31/048 |
| CN | 109340664 A | * | 2/2019 | ......... | H01L 31/0481 |
| ES | 2333756 A1 | * | 2/2010 | ........... | H01L 31/048 |
| ES | 2962382 T3 | * | 3/2024 | ................ | F21S 8/08 |
| WO | WO-2004017441 A1 | * | 2/2004 | ......... | H01L 51/5237 |

OTHER PUBLICATIONS

"UV Adhesives" definition as provided by PANACOL, accessed from https://www.panacol.com/adhesive-glue/uv-adhesive, accessed on Aug. 7, 2024.*

* cited by examiner

*Primary Examiner* — Golam Mowla
(74) *Attorney, Agent, or Firm* — Daniel M. Cohn

(57) ABSTRACT

A photovoltaic lamp comprises a photovoltaic cover and a lamp body. The photovoltaic cover covers a side away from a light-emitting surface of the lamp body. A receiving groove is formed in a side, away from the lamp body, of the photovoltaic cover. A glass cover is fixedly attached to an opening of the receiving groove with an UV adhesive. A silicon cell is arranged between the glass cover and the bottom of the receiving groove. The glass cover together with the UV adhesive is used as a packaging structure of the silicon cell, thus improving the photoelectric conversion efficiency of the silicon cell; and the glass cover is small in deformation, unlikely to be damaged and easy to clean, thus reducing the production input, shortening the production time, and improving the production efficiency and the stability of the high-quality output of products.

5 Claims, 4 Drawing Sheets

PHOTOVOLTAIC LAMP USING UV ADHESIVE AND GLASS COVER FOR PACKAGING

BACKGROUND OF THE INVENTION

1. Technical Field

The invention relates to the technical field of lamps, and particularly relates to a photovoltaic lamp using a UV adhesive and a glass cover for packaging.

2. Description of Related Art

With the development of economy and the advancement of society, people's requirements for energy are increasingly higher, and searching for new energy becomes an urgent task faced by humans at present. Solar power has incomparable advantages in cleanliness, safety and the pervasiveness and adequacy of resources as compared with thermal power, hydropower and nuclear power, thus being considered as the most important energy in the 21th century.

At present, solar power application technique have witnessed great breakthroughs, and especially the development of the solar photovoltaic technique brings a broader prospect for the application of solar power in the lighting filed. Solar lamps have almost taken over the entire lighting market.

A solar lamp is mainly composed of a solar cell module, a storage battery pack, an intelligent controller, an energy-efficient light source, a lamp post and a mounting material. The intelligent controller of existing solar lamps can control the lamps to work at night and stop working in daytime to save energy.

In existing solar lamps, the packaging structure of a solar panel is generally obtained by vacuum high-temperature lamination and high-temperature natural curing of epoxy resin, which are realized by long-term operation of high-power electric heating equipment, thereby greatly limiting the production efficiency of products; and the epoxy resin is likely to be oxidized and turn yellow after long-term exposure to the outdoor space and reduces the light transmittance, thus compromising the photoelectric conversion efficiency of the solar panel and shortening the service life of products.

BRIEF SUMMARY OF THE INVENTION

The invention discloses a photovoltaic lamp using a UV adhesive and a glass cover for packaging to solve the problems, mentioned in the description of related art, that the packaging structure of existing solar panels is low in production efficiency and excessively high in production cost and reduces the light transmittance due to aging caused by long-term exposure to the outdoor space, thus compromising the photoelectric conversion efficiency of the solar panels and shortening the service life of products.

To solve the abovementioned technical problems, the invention provides the following technical solution:

A photovoltaic lamp using a UV adhesive and a glass cover for packaging comprises a photovoltaic cover and a lamp body, wherein the photovoltaic cover covers a side away from a light-emitting surface of the lamp body, a receiving groove is formed in a side, away from the lamp body, of the photovoltaic cover, a glass cover is arranged at an opening of the receiving groove and fixedly attached to the opening of the receiving groove with an UV adhesive, an outer edge of the glass cover is attached to an inner wall of the receiving groove, a silicon cell is arranged between the glass cover and a bottom of the receiving groove, a wire hole allowing a wire of the silicon cell to stretch out of the receiving groove is formed in the receiving groove, and the silicon cell is electrically connected to the lamp body.

Preferably, multiple silicon cells are arranged between the glass cover and the bottom of the receiving groove, and positive and negative poles of the multiple silicon cells are connected end-to-end to form a cascaded structure.

Preferably, a shroud for covering the wire is arranged on sides, close to the glass cover, of the silicon cells.

Preferably, the photovoltaic cover covers the side away from the light-emitting surface of the lamp body, and a receiving space is formed between the photovoltaic cover and the lamp body; a battery and a PCB are arranged in the receiving space, the battery is electrically connected to the PCB, a filament is arranged on the PCB, a filament hole allowing the filament to stretch out of the lamp body is formed in a side, away from the photovoltaic cover, of the lamp body, and the silicon cells are electrically connected to the PCB.

Preferably, a toggle switch used for control is arranged on the PCB, and a switch hole allowing the toggle switch to stretch out of the lamp body is formed in the side, away from the photovoltaic cover, of the lamp body.

Preferably, a rubber sleeve is arranged outside the toggle switch, an inner side of the rubber sleeve abuts against an outer surface of the toggle switch, and an outer side of the rubber sleeve abuts against an inner surface of the receiving space.

Preferably, a glass lamp shade is arranged on the side, away from the photovoltaic cover, of the lamp body, and the filament is arranged in the lamp shade.

The invention has the following beneficial effects: the photovoltaic lamp using a UV adhesive and a glass cover for packaging comprises a photovoltaic cover and a lamp body, wherein the photovoltaic cover covers a side away from a light-emitting surface of the lamp body, a receiving groove is formed in a side, away from the lamp body, of the photovoltaic cover, a glass cover is arranged at an opening of the receiving groove and fixedly attached to the opening of the receiving groove with an UV adhesive, an outer edge of the glass cover is attached to an inner wall of the receiving groove, a silicon cell is arranged between the glass cover and the bottom of the receiving groove, a wire hole allowing a wire of the silicon cell to stretch out of the receiving groove is formed in the receiving groove, and the silicon cell is electrically connected to the lamp body. The glass cover together with the UV adhesive is used as a packaging structure of the silicon cell, thus improving the light transmittance and indirectly improving the photoelectric conversion efficiency of the silicon cell; and the glass cover is small in deformation, unlikely to be damaged, long in service life and easy to clean; and when lamps are produced, the solution can reduce the production input, shorten the production time, and improve the production efficiency and the stability of the high-quality output of products.

Reference signs of main elements: 1, lamp body; 2, photovoltaic cover; 3, lamp shade; 4, battery case; 5, battery; 6, PCB; 7, silicon cell; 8, glass cover; 9, wire hole; 10, first waterproof groove; 11, a second waterproof groove; 13, shroud; 14, connecting wire.

DETAILED DESCRIPTION OF THE INVENTION

To make the purposes, technical solutions and advantages of the embodiments of the invention clearer, the technical solutions of the embodiments of the invention will be clearly and completely described below in conjunction with accompanying drawings of the embodiments. Obviously, the embodiments in the following description are merely illustrative ones, and are not all possible ones of the invention. Generally, components in the embodiments of the invention described and illustrated in the accompanying drawings can be arranged and designed according to different configurations.

The embodiments described in detail below in conjunction with the accompanying drawings of the invention are not intended to limit the protection scope of the invention, and are merely selected embodiments of the invention. All other embodiments obtained by those ordinarily skilled in the art according to the following ones without creative labor should also fall within the protection scope of the invention.

Figure 1:
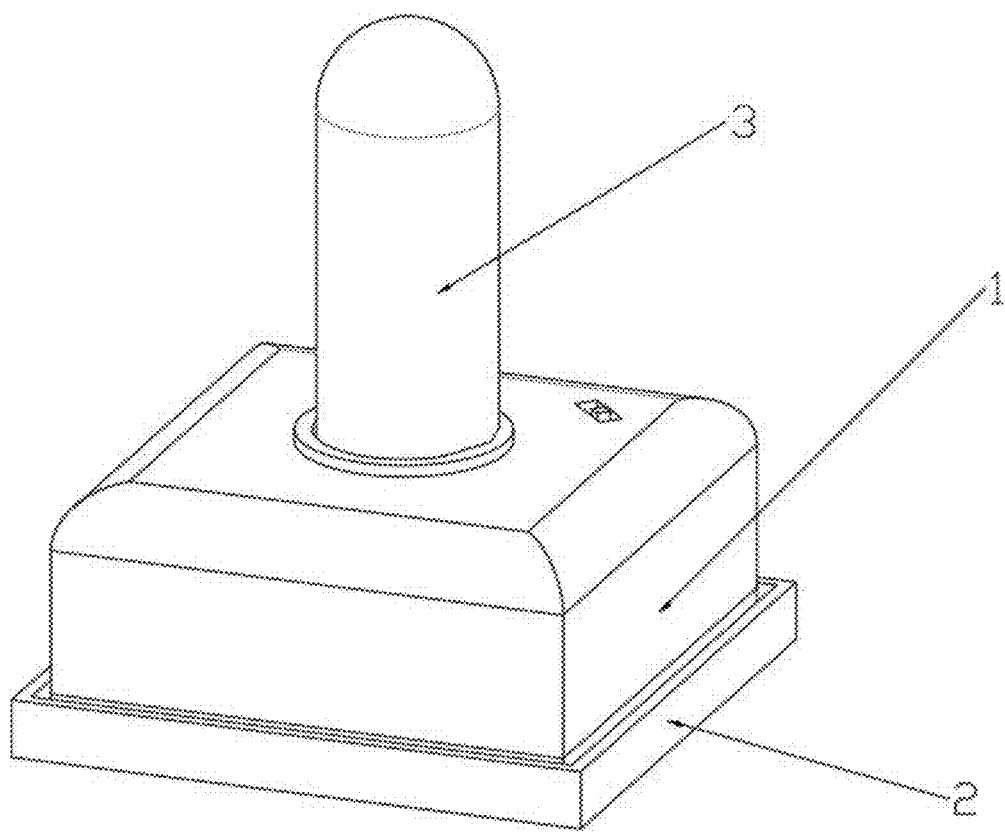
FIG. 1 is an overall external view of the invention.
Figure 2:
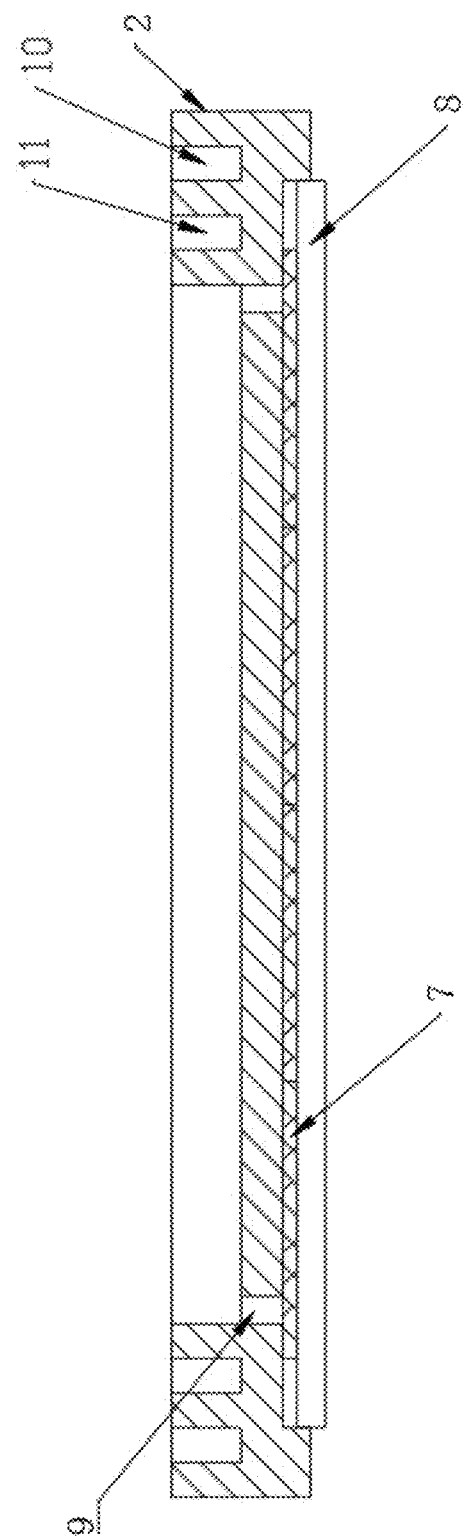
FIG. 2 is a side sectional view of a photovoltaic cover according to the invention.

Referring to FIG. 1 and FIG. 2, the invention provides a photovoltaic lamp using a UV adhesive and a glass cover 8 for packaging, comprising a photovoltaic cover 2 and a lamp body 1, wherein the photovoltaic cover 2 covers a side away from a light-emitting surface of the lamp body 1, a receiving groove is formed in a side, away from the lamp body 1, of the photovoltaic cover 2, a glass cover 8 is arranged at an opening of the receiving groove and fixedly attached to the opening of the receiving groove with a UV adhesive, an outer edge of the glass cover 8 is attached to an inner wall of the receiving groove, a silicon cell 7 is arranged between the glass cover 8 and the bottom of the receiving groove, a wire hole 9 allowing a wire of the silicon cell 7 to stretch out of the receiving groove is formed in the receiving groove, and the silicon cell 7 is electrically connected to the lamp body 1. Solar photovoltaic panels on the present markets are generally machined and produced by vacuum high-temperature lamination and high-temperature natural curing of epoxy resin, which are realized by long-term operation of 10 KW-100 KW electric heating equipment. According to the solution provided by the application, the glass cover 8 together with the UV adhesive is used as a packaging structure of the silicon cell 7, and the power consumed for machining and producing such as packaging structure is merely 100 W-1 KW; compared with the curing rate of epoxy resin, the production time is shortened from 3-5 hours to 2-5 seconds, thus greatly reducing the production input, greatly improving the production efficiency and also improving the stability of the output of products; compared with the epoxy resin packaging structure, the glass cover 8 will not be oxidized and turn yellow after being used outdoors for a long time, thus improving the light transmittance and indirectly improving the photoelectric conversion efficiency of the silicon cell 7; and the glass cover 8 is small in deformation, unlikely to be damaged, long in service life and easy to clean.

Figure 3:
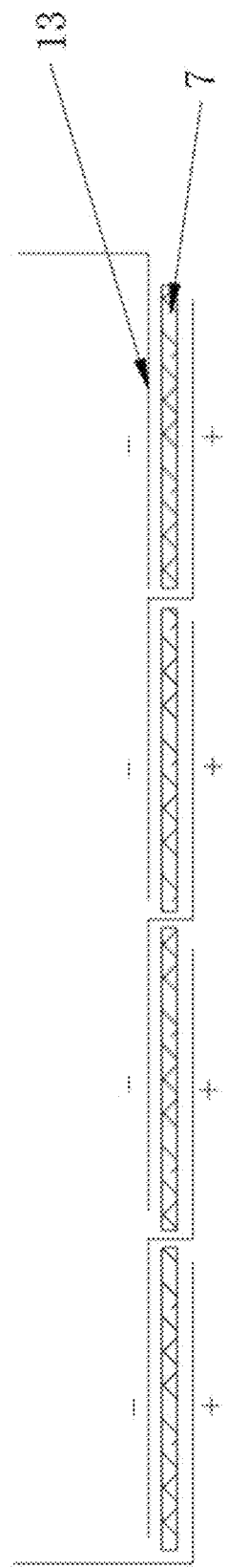
FIG. 3 is a schematic connection diagram of silicon cells according to the invention.

Referring to FIG. 3, specifically, multiple silicon cells 7 are arranged between the glass cover 8 and the bottom of the receiving groove, and positive and negative poles of the multiple silicon cells 7 are connected end-to-end through a connecting wire 14 to form a cascaded structure. Multiple silicon cells 7 are arranged to enlarge the sunlight receiving area, thus improving the sunlight absorption capacity of the photovoltaic cover 2.

Specifically, a shroud 13 for covering the wire is arranged on sides, close to the glass cover 8, of the silicon cells 7, and the shroud 13 is a piece of black tape and covers the connecting wire 14 of the silicon cells 7, thus improving the aesthetics of the photovoltaic cover 2.

Figure 4:
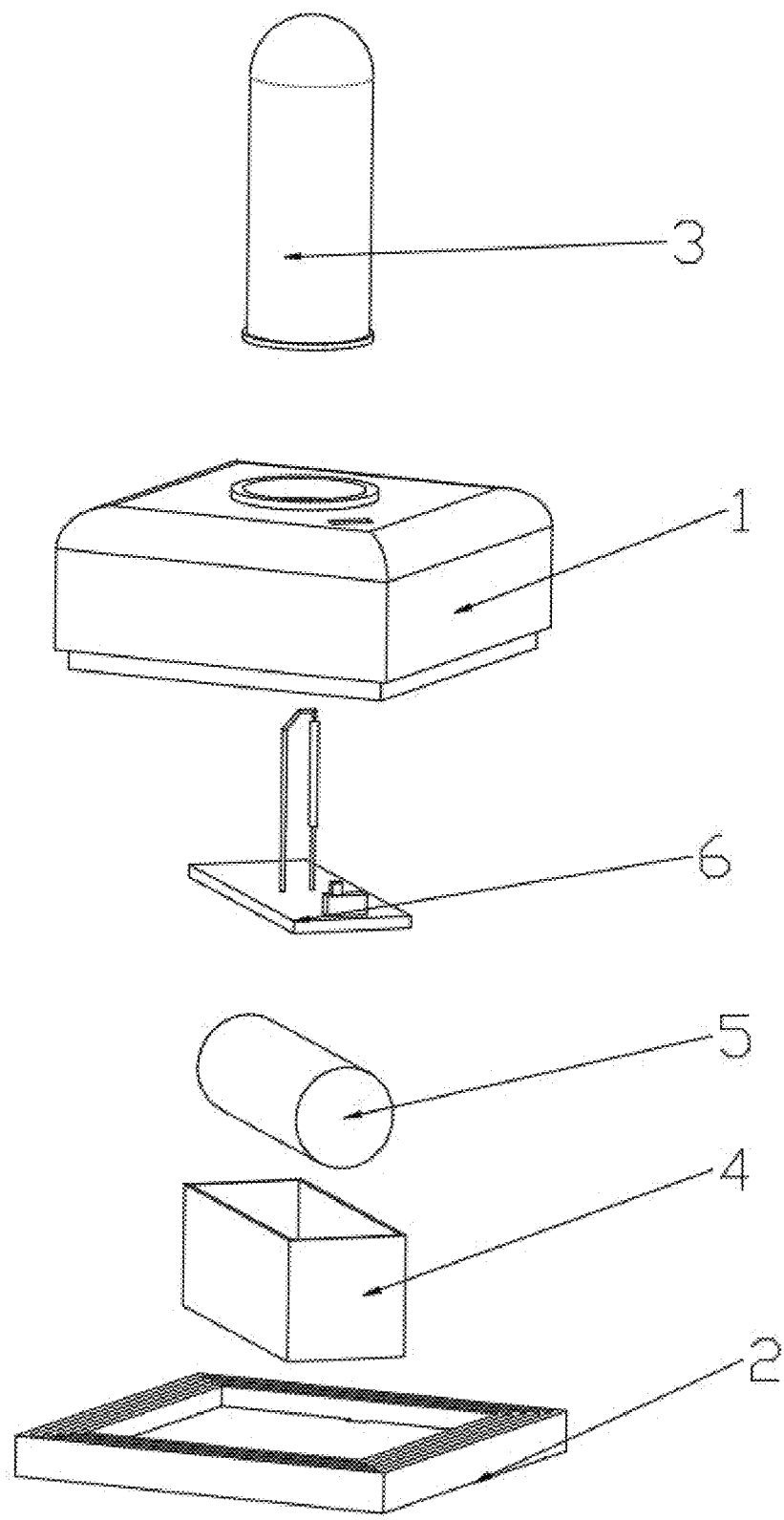
FIG. 4 is schematic exploded view of the invention.

Referring to FIG. 4, specifically, the photovoltaic cover 2 covers the side away from the light-emitting surface of the lamp body 1, and a receiving space is formed between the photovoltaic cover 2 and the lamp body 1; a battery case 4, a battery 5 and a PCB 6 are arranged in the receiving space, the battery 5 is electrically connected to the PCB 6 and arranged in the battery case 4, the battery case 4 is fixedly connected to the photovoltaic cover 2, a filament is arranged on the PCB 6, a filament hole allowing the filament to stretch out of the lamp body 1 is formed in a side, away from the photovoltaic cover 2, of the lamp body 1, the silicon cells 7 are electrically connected to the PCB 6, and a current threshold is set in the PCB 6; when a current produced by sunlight received by the photovoltaic cover 2 is greater than the current threshold, a circuit connected to the filament on the PCB 6 is opened; and when the current produced by sunlight received by the photovoltaic cover 2 is less than the current threshold, the circuit connected to the filament on the PCB 6 is closed.

Specifically, a toggle switch used for control is arranged on the PCB 6, a switch hole allowing the toggle switch to stretch out of the lamp body 1 is formed in the side, away from the photovoltaic cover 2, of the lamp body 1, and the toggle switch is used for controlling on-off of the filament.

Specifically, a rubber sleeve is arranged outside the toggle switch, an inner side of the rubber sleeve abuts against an outer surface of the toggle switch, an outer side of the rubber sleeve abuts against an inner surface of the receiving space, such that the rubber sleeve exactly seals the switch hole, thus preventing rainwater from entering the lamp body 1 from the outside via the switch hole, which may otherwise damage the lamp.

Specifically, a glass lamp shade 3 is arranged on the side, away from the photovoltaic cover 2, of the lamp body 1, and the filament is arranged in the lamp shade 3. The lamp shade 3 is used for protecting the filament exposed to the air under the condition of guaranteeing the light transmittance.

Referring to FIG. 2, specifically, a first waterproof groove 10 and a second waterproof groove 11 are formed in a side, close to the lamp body 1, of the photovoltaic cover 2, the first waterproof groove 10 and the second waterproof grooves 11 are both circular grooves, the second waterproof groove 11 is located in an area defined by the first waterproof groove 10, and the side, close to the photovoltaic cover 2, of the lamp body 1 is inlaid in the second waterproof groove 11. When the lamp is used outdoors, because the joint between the lamp body 1 and the second waterproof groove 11 is located above the bottom of the first waterproof groove 10, rainwater falling into the first waterproof groove 10 is unlikely to enter the lamp body 1 via a gap in the joint of the lamp body 1 and the second waterproof groove 11, thus fulfill a waterproof effect.

The embodiments disclosed above are merely several specific ones of the invention, and the invention is not limited to the above embodiments. Any variations that can be thought out by those skilled in the art should fall within the protection scope of the invention.

What is claimed is:

1. A photovoltaic lamp using an ultraviolet (UV) adhesive and a glass cover for packaging, comprising a photovoltaic cover and a lamp body, wherein the UV adhesive excludes epoxy resin, the photovoltaic cover covers a side away from a light-emitting surface of the lamp body, a receiving groove is formed in a side, away from the lamp body, of the photovoltaic cover, the glass cover is arranged at an opening of the receiving groove and fixedly attached to the opening of the receiving groove with the UV adhesive, an outer edge of the glass cover is attached to an inner wall of the receiving groove, a silicon cell is arranged between the glass cover and a bottom of the receiving groove, a wire hole allowing a wire of the silicon cell to stretch out of the receiving groove is formed in the receiving groove, and the silicon cell is electrically connected to the lamp body.

2. The photovoltaic lamp using the UV adhesive and the glass cover for packaging according to claim 1, wherein the photovoltaic cover covers the side away from the light-emitting surface of the lamp body, and a receiving space is formed between the photovoltaic cover and the lamp body; a battery and a PCB are arranged in the receiving space, the battery is electrically connected to the PCB, a filament is arranged on the PCB, a filament hole allowing the filament to stretch out of the lamp body is formed in a side, away from the photovoltaic cover, of the lamp body, and the silicon cell is electrically connected to the PCB.

3. The photovoltaic lamp using the UV adhesive and the glass cover for packaging according to claim 2, wherein a toggle switch used for control is arranged on the PCB, and a switch hole allowing the toggle switch to stretch out of the lamp body is formed in the side, away from the photovoltaic cover, of the lamp body.

4. The photovoltaic lamp using the UV adhesive and the glass cover for packaging according to claim 3, wherein a rubber sleeve is arranged outside the toggle switch, an inner side of the rubber sleeve abuts against an outer surface of the toggle switch, and an outer side of the rubber sleeve abuts against an inner surface of the receiving space.

5. The photovoltaic lamp using the UV adhesive and the glass cover for packaging according to claim 2, wherein a glass lamp shade is arranged on the side, away from the photovoltaic cover, of the lamp body, and the filament is arranged in the lamp shade.

\* \* \* \* \*